ELECTRONIC DECODER CIRCUITS
Filed March 23, 1964
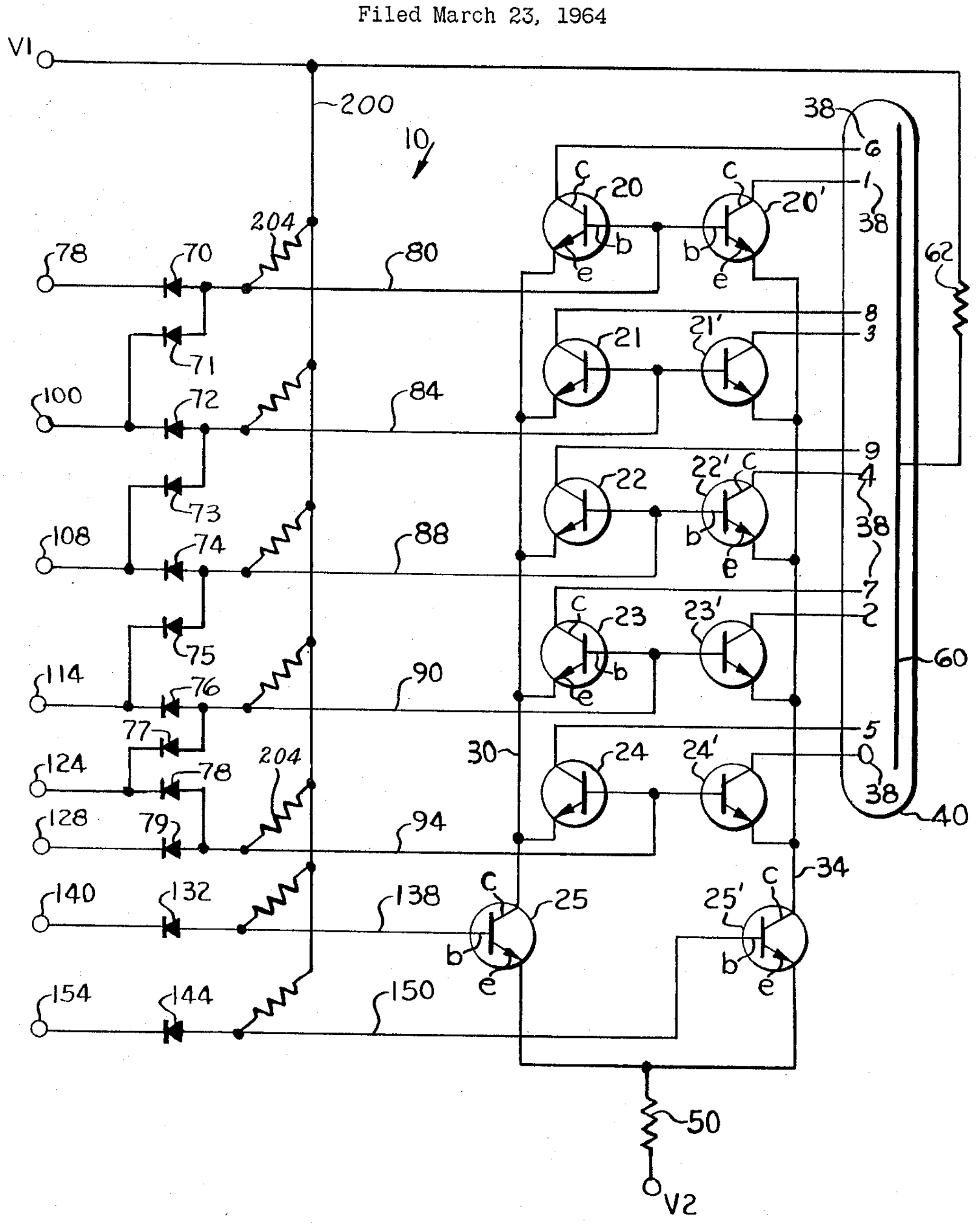
INVENTOR.
JAMES J. KLINIKOWSKI
BY Robert A. Green
ATTORNEY

United States Patent Office 3,304,548

Patented Feb. 14, 1967

3,304,548

ELECTRONIC DECODER CIRCUITS

James J. Klinikowski, Somerville, N.J., assignor to Burroughs Corporation, Detroit, Mich., a corporation of Michigan Filed Mar. 23, 1964, Ser. No. 353,846

4 Claims. (Cl. 340—347)

This invention relates to electronic decoder circuits and, particularly, to a diode matrix decoder circuit usable to convert several different binary codes to decimal code.

Electronic decoder circuits using diode matrices are known for converting binary-coded decimal signals to pure decimal signals. However, none of these circuits is what may be termed a "universal" circuit, that is, these circuits cannot be used to decode signals of more than one code system without relatively elaborate modification of the diode matrix and associated circuitry for each code system.

Accordingly, the objects of the present invention are directed toward the provision of an improved electronic decoder circuit using a relatively simple diode matrix and adaptable to decode signals in several different code systems without modification of the diode matrix.

A circuit embodying the invention is particularly useful for decoding biquinary codes and includes, briefly, five pairs of transistors connected together in biquinary fashion, that is, in two groups of five, with one transistor of each pair connected in a group. In addition, a separate auxiliary control transistor is provided to control the operation of each group of five transistors. All of the transistors, including the control transistors, are coupled to a diode matrix in which the diodes are interconnected to provide a plurality of AND gates. A plurality of input terminals are coupled to the AND gates and the signal bits of various binary-coded signals are adapted to be coupled in proper order to selected ones of these terminals so that the proper decimal output is provided for each code input.

In the drawing, the single figure is a schematic representation of a decoder circuit embodying the invention.

A circuit 10 embodying the invention includes five pairs of transistors including the pairs 20 and 20', 21 and 21', 22 and 22', 23 and 23', 24 and 24'. In addition, the circuit includes a pair of control transistors 25 and 25'. Each transistor includes base, emitter, and collector electrodes *b*, *e*, and *c*, respectively. The control transistor 25 has its output or collector electrode coupled through lead 30 to the emitter electrode of one transistor of each pair, for example, transistors 20 to 24. Similarly, the collector or output electrode of control transistor 25' is coupled by lead 34 to the emitter electrode of each of the other transistors of each pair.

The collector or output electrode of each transistor 20 to 24 and 20' to 24' is connected to one of the glow cathodes 38 of a multi-cathode glow tube 40 such as the type 6844A tube to provide a visible display of the decimal output of the circuit 10. In the circuit shown, and for a 5–3–1–1' code to be described, the collectors of transistors 20 and 20' are connected to the cathode numerals "6" and "1," respectively; the collectors of transistors 21 and 21' are connected to the cathode numerals "8" and "3," respectively; the collector electrodes of transistors 22 and 22' are connected to cathode numerals "9" and "4," respectively; the collector electrodes of transistors 23 and 23' are connected to cathode numerals "7" and "2," respectively; and the collector electrodes of transistors 24 and 24' are connected to cathode numerals "5" and "0," respectively.

The emitter electrodes of control transistors 25 and 25' are coupled together and through a suitable resistor 50 to a power source such that the emitters of these transistors are at a potential between logical 1 and logical 0, as defined below.

The tube 40 also includes an anode electrode 60 which is coupled through a resistor 62 to a positive D.C. power source V1.

A diode matrix decoding network, embodying the invention, for converting binary-coded decimal information to pure decimal information is coupled to the pairs of transistors to perform the required signal conversion or decoding operation. The diode matrix includes ten diodes, 70, 71, 72, 73, 74, 75, 76, 77, 78, 79, connected in pairs to form two-diode AND gates. Diodes 70 and 71 form an AND gate and have their diodes connected through matrix output lead 80 to the base electrodes of transistors 20 and 20'; diodes 72 and 73 form an AND gate and have their anodes connected through matrix output lead 84 to the base electrodes of transistors 21 and 21'; diodes 74 and 75 form an AND gate and have their anodes connected through matrix output lead 88 to the base electrodes of transistors 22 and 22'; diodes 76 and 77 form an AND gate and have their anodes connected through matrix output lead 90 to the base electrodes of transistors 23 and 23'; and diodes 78 and 79 form an AND gate and have their anodes connected through matrix output lead 94 to the base electrodes of transistors 24 and 24'. The cathodes of diodes 71 and 72 are connected together by a lead which is provided with an input terminal 100; the cathodes of diodes 73 and 74 are connected together by a lead which is provided with an input terminal 108; the cathodes of diodes 75 and 76 are connected together by a lead which is provided with an input terminal 114; and the cathodes of diodes 77 and 78 are connected together by a lead which is provided with an input terminal 124. The cathode of diode 79 is provided with an input terminal 128. A single diode 132 has its anode connected through matrix output lead 138 to the base electrode of transistor 25, and its cathode is provided with an input terminal 140. Another single diode 144 has its anode coupled through matrix output lead 150 to the base electrode of transistor 25', and its cathode is provided with an input terminal 154.

The positive D.C. power source V1 is coupled through lead 200 and a separate resistor 204 to each of the leads 80, 84, 88, 90, 94, 138, and 150.

The circuit of the invention can be used to convert several different four-bit binary-coded decimal codes to pure decimal. These codes include the 4–2'–2–1 code, the 5–3–1–1' code, and a Beam–X Gray code. The truth tables for these various codes are shown below.

| 5 | 3 | 1 | 1' | Decimal number |
|---|---|---|---|---|
| Code bits | | | | |
| 0 | 0 | 0 | 0 | 0 |
| 0 | 0 | 0 | 1 | 1 |
| 0 | 0 | 1 | 1 | 2 |
| 0 | 1 | 0 | 0 | 3 |
| 0 | 1 | 1 | 0 | 4 |
| 1 | 0 | 0 | 0 | 5 |
| 1 | 0 | 0 | 1 | 6 |
| 1 | 0 | 1 | 1 | 7 |
| 1 | 1 | 0 | 0 | 8 |
| 1 | 1 | 1 | 0 | 9 |

| 4 | 2' | 2 | 1 | Decimal number |
|---|---|---|---|---|
| Code bits | | | | |
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 1 | 0 | 4 |
| 0 | 1 | 1 | 1 | 5 |
| 1 | 1 | 0 | 0 | 6 |
| 1 | 1 | 0 | 1 | 7 |
| 1 | 1 | 1 | 0 | 8 |
| 1 | 1 | 1 | 1 | 9 |

| Beam-X Gray | | | | Decimal number |
|---|---|---|---|---|
| G4 | G3 | G2 | G1 | |
| Code bits | | | | |
| 1 | 0 | 0 | 0 | 0 |
| 1 | 1 | 0 | 0 | 1 |
| 0 | 1 | 0 | 0 | 2 |
| 0 | 1 | 1 | 0 | 3 |
| 0 | 0 | 1 | 1 | 4 |
| 0 | 0 | 1 | 1 | 5 |
| 0 | 1 | 1 | 1 | 6 |
| 0 | 1 | 0 | 1 | 7 |
| 1 | 1 | 0 | 1 | 8 |
| 1 | 0 | 0 | 1 | 9 |

In order to utilize the circuit of FIG. 1 to convert the 5–3–1–1' code to pure decimal, the signal bits of the binary-coded decimal signal are connected to the input terminals as follows:

the 1' bit is coupled to the terminal 78
the $\overline{1'}$ bit is coupled to the terminal 128
the 3 bit is coupled to the terminal 108
the 1 bit is coupled to the terminal 114
the $\overline{3}$ bit is coupled to the terminal 124
the $\overline{1}$ bit is coupled to the terminal 100
the 5 bit is coupled to the terminal 140
the $\overline{5}$ bit is coupled to the terminal 154

It is understood that $\overline{1'}$ is the complement of 1, $\overline{3}$ is the complement of 3, etc. In addition, logical 0 in the truth table represents a negative voltage, for example, −6 volts, and logical 1 represents a more positive voltage, for example, zero volts.

In the circuit 10, a current flow path is provided from the positive D.C. power source V1 through each of the resistors 204 and through each of the matrix output lines 80, 84, 88, 90, 94, 138, and 150 and through one of the transistors of each pair, depending on the state of the control transistors 25 and 25'. The presence or absence of such current flow in any of these seven matrix output lines is determied by the potential applied to the line by the combination of input signals appearing at the input to the diode matrix. If a negative potential appears on a matrix output line, then no current flows through it or through either of the transistors to which it is connected. If a more positive potential appears on the line, then current can flow through this lead and through one of the transistors of the pair of transistors to which it is connected, depending on which transistor is energized by one of the auxiliary transistors 25 or 25'.

Assuming that the group of binary-coded decimal signal bits representing decimal zero in the 5–3–1–1' code is applied to the diode matrix, then bits 5, 3, 1, and 1' are logical 0 which is −6 volts and their complements are logical 1 which is zero volts. This combination of signal bits turns on control transistor 25' and produces current flow only in matrix output line 94, and this current turns on transistor 24' which in turn energizes cathode numeral "0" in tube 40.

In similar fashion, the other combinations of signal bits in the 5–3–1–1' truth table, when applied to the input of the diode matrix, cause current to flow in only one matrix output line. The one matrix output line energizes the transistor coupled to the glow cathode numeral representing the correct decimal number corresponding to the applied combination of signal bits.

In order to use the circuit 10 to perform the same decoding operation for the other codes, it is only necessary to (1) connect the signal bits to the proper input terminals and (2) connect the collector electrodes of the transistor pairs to the correct cathode electrodes in the indicator tube 40.

The following tables show the other codes and the arrangement of their connections to the input terminals and the corresponding connections of the collectors of the transistors to glow cathodes in tube 40.

| Terminal | 4 2' 2 1 Bits | Transistors | Cathode Numeral |
|---|---|---|---|
| 78 | $\overline{4}$ | 20 | 5 |
| 100 | 2' | 20' | 4 |
| 108 | $\overline{2}$ | 21 | 7 |
| 114 | $\overline{2'}$ | 21' | 6 |
| 124 | 2 | 22 | 1 |
| 128 | 4 | 22' | 0 |
| 140 | 1 | 23 | 3 |
| 154 | $\overline{1}$ | 23' | 2 |
| | | 24 | 9 |
| | | 24' | 8 |

| Terminal | Beam-X Gray Bits | Transistors | Cathode Numeral |
|---|---|---|---|
| 78 | $\overline{G_2}$ | 20 | 7 |
| 100 | $\overline{G_4}$ | 20' | 2 |
| 108 | $\overline{G_3}$ | 21 | 5 |
| 114 | $G_4$ | 21' | 4 |
| 124 | $G_3$ | 22 | 9 |
| 128 | $G_2$ | 22' | 0 |
| 140 | $G_1$ | 23 | 8 |
| 154 | $\overline{G_1}$ | 23' | 1 |
| | | 24 | 6 |
| | | 24' | 3 |

From the foregoing description, it can be seen that the circuit of the invention can be used to convert many binary-coded decimal codes to pure decimal code. It is noted that each such code which can be decoded has a biquinary characteristic, which means that the truth table for the code includes one column of bits containing five logical zeroes and five logical ones. This column of signal bits is called the separator or control column and is used to operate the auxiliary transistors. In addition, an examination of the other rows and columns of bits shows that the rows of bits can be grouped into five pairs of identical rows of bits with one member of a pair being associated with a logical zero in the separator column and the other member of the pair being associated with a logical one in the separator column. Those skilled in the art will understand that this type of code produces a two-layer Veitch diagram which includes three signals in one layer and two signals in the other. Thus, it appears that there are many codes which satisfy these requirements and can be decoded by the circuit 10.

What is claimed is:

1. A decoder circuit including five pairs of transistors and a pair of auxiliary transistors, each of which is coupled to and controls the operation of one transistor of each pair of transistors, a diode matrix, eight input lines to said diode matrix, seven output lines from said diode matrix coupled to said transistors, a two-diode AND gate in each of said five lines and a single diode in each line coupled to said auxiliary transistors, there thus being five AND gates, one diode of each two-diode AND gate being connected to one diode of one other AND gate to form diode sub-pairs, three of said five AND gates thus having both diodes connected to a diode in another AND gate, two of said five AND gates having only one diode connected to a diode in another AND gate, a signal input terminal coupled to each of said sub-pairs of diodes and to the one diode in said two AND gates which are not connected to diodes in other AND gates, said input terminals being adapted to receive different combinations of signal bits in one code and providing current flow on one output line from the diode matrix to one of said pairs of transistors and to one of said auxiliary transistors whereby one transistor of one of said pairs of transistors is turned on and provides an output signal having a meaning in another code.

2. A decoder circuit including five pairs of transistors and a pair of auxiliary transistors, each of which is coupled to and controls the operation of one transistor of each pair of transistors, a diode matrix, eight input lines to said diode matrix, seven output lines from said diode matrix with five lines of said seven lines coupled one to each of said five pairs of transistors and one line coupled to each of said auxiliary transistors, a two-diode AND gate in each of said five lines and a single diode in each line coupled to said auxiliary transistors, there thus being five AND gates, one diode of each two-diode AND gate being connected to one diode of one other AND gate to form diode sub-pairs, three of said five AND gates thus having both diodes connected to a diode in another AND gate, two of said five AND gates having only one diode connected to a diode in another AND gate, a signal input terminal coupled to each of said sub-pairs of diodes and to the one diode in said two AND gates which are not connected to diodes in other AND gates, said input terminals being adapted to receive different combinations of signal bits in one code and providing current flow on one output line from the diode matrix to one of said pairs of transistors and to one of said auxiliary transistors whereby one transistor of one of said pairs of transistors is turned on and provides an output signal having a meaning in another code.

3. The circuit defined in claim 2 and including a decimal display device coupled to said pairs of transistors to provide a visual display of the output signal which results from a signal decoding operation.

4. A circuit for use in decoding biquinary code signals comprising five pairs of decimal-representing transistors, two auxiliary control transistors, each coupled to and controlling the operation of one transistor of each pair of transistors, a diode matrix, eight input lines to said diode matrix, seven output lines from said diode matrix, said diode matrix including two single diodes in two of said output lines and a two-diode AND gate in five of said output lines, said input lines being adapted to receive different combinations of signal bits in one code and providing current flow on one output line from the diode matrix to one of said pairs of transistors and to one of said auxiliary transistors whereby one transistor of one of said pairs of transistors is turned on and provides an output signal having a meaning in decimal code.

References Cited by the Examiner

UNITED STATES PATENTS 3,086,198 4/1963 Tate ---------------- 340—347

OTHER REFERENCES

Decoder Driver For Indicator Tube, in IBM Technical Disclosure Bulletin, vol. 3, No. 2, July 1960, p. 38–39.

MAYNARD R. WILBUR, *Primary Examiner.*

MALCOLM A. MORRISON, *Examiner.*

A. L. NEWMAN, *Assistant Examiner.*